United States Patent
Kanamoto et al.

(10) Patent No.: US 8,546,682 B2
(45) Date of Patent: Oct. 1, 2013

(54) PHOTOELECTRIC CONVERTER AND MANUFACTURING METHOD THEREOF, AND PHOTOELECTRIC CONVERSION MODULE

(75) Inventors: Kyozo Kanamoto, Tokyo (JP); Hirofumi Konishi, Tokyo (JP); Hidetada Tokioka, Tokyo (JP); Mikio Yamamuka, Tokyo (JP); Hiroyuki Fuchigami, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 49 days.

(21) Appl. No.: 13/334,892

(22) Filed: Dec. 22, 2011

(65) Prior Publication Data
US 2012/0160298 A1 Jun. 28, 2012

(30) Foreign Application Priority Data

Dec. 24, 2010 (JP) .................................. 2010-288704
Apr. 25, 2011 (JP) .................................. 2011-097642
Nov. 29, 2011 (JP) .................................. 2011-260856

(51) Int. Cl.
*H01L 31/00* (2006.01)

(52) U.S. Cl.
USPC .......................................... 136/255; 136/256

(58) Field of Classification Search
USPC ................................................. 136/255, 256
See application file for complete search history.

(56) References Cited

U.S. PATENT DOCUMENTS

| 2003/0230338 A1* | 12/2003 | Menezes | 136/265 |
| 2006/0086386 A1 | 4/2006 | Nakano et al. | |
| 2010/0181566 A1* | 7/2010 | Lee | 257/43 |

FOREIGN PATENT DOCUMENTS

| JP | 6-61513 | 3/1994 |
| JP | 3007758 | 11/1999 |
| JP | 2004-363290 | 12/2004 |
| JP | 2006-120747 | 5/2006 |

OTHER PUBLICATIONS

U.S. Appl. No. 13/806,204, filed Jan. 14, 2013, Konishi, et al.

* cited by examiner

*Primary Examiner* — Eli Mekhlin
(74) *Attorney, Agent, or Firm* — Oblon, Spivak, McClelland, Maier & Neustadt, L.L.P.

(57) ABSTRACT

A photoelectric converter in which an intermediate layer is provided between a first photoelectric-conversion-layer including a first p-type-semiconductor-layer and a first n-type-semiconductor-layer and a second photoelectric-conversion-layer including a second p-type-semiconductor-layer and a second n-type-semiconductor-layer. The intermediate layer includes an n-type-transparent conductive-oxide-film in contact with the first n-type-semiconductor-layer and a p-type-transparent-conductive oxide-film in contact with the second p-type-semiconductor-layer respectively having a bandgap equal to or higher than 1.5 electron volts. A width of a low carrier concentration region in a film thickness direction, in which a concentration of a free carrier formed near at least one of an interface on which the p-type-transparent-conductive-oxide-film comes into contact with the n-type-transparent-conductive-oxide-film and an interface on which the p-type-transparent-conductive-oxide-film comes into contact with the second p-type-semiconductor-layer is equal to or lower than $1\times10^{18}$ cm$^{-3}$, is equal to or less than 5 nanometers.

18 Claims, 5 Drawing Sheets

FIG.5

# PHOTOELECTRIC CONVERTER AND MANUFACTURING METHOD THEREOF, AND PHOTOELECTRIC CONVERSION MODULE

BACKGROUND OF THE INVENTION

1. Field of the Invention

The present invention relates to a photoelectric converter that converts optical energy to electric energy and a manufacturing method thereof, and a photoelectric conversion module.

2. Description of the Related Art

In a photoelectric converter that converts optical energy to electric energy, in order to increase its photoelectric conversion efficiency, there has been known a stacked thin-film solar battery in which a plurality of thin-film photoelectric conversion layers each having different light-absorbing wavelength characteristics are stacked. In such a conventional stacked thin-film solar battery, a plurality of photoelectric conversion elements are stacked, which respectively include a photoelectric conversion layer in which thin-film semiconductors are deposited in an order of a p-type layer, an i-type layer, and an n-type layer, for example, on an insulating transparent substrate on which a transparent electrode is formed. A reflective conductive film is then formed as a backside electrode, thereby generating photovoltaic power by incidence of light from a side of the insulating transparent substrate.

To smoothly transmit an electric current between stacked photoelectric conversion elements, an intermediate layer having an electrical conductivity is inserted between these photoelectric conversion elements. As the intermediate layer, a material having an optical property that reflects or transmits light in a specific wavelength range can be used. For example, in a GaAs compound semiconductor, as disclosed in Japanese Patent Application Laid-open No. H06-061513, a low resistance structure using a tunnel junction by a high electron-concentration n-layer with a wide bandgap and a high hole-concentration p-layer has been known as the intermediate layer.

Meanwhile, in Si photoelectric conversion elements that are most common in general households, no intermediate layer using such a wide bandgap tunnel junction is used. As a type of the Si photoelectric conversion elements, Japanese Patent Application Laid-open No. 2006-120747 discloses that ZnO, ITO, or $SnO_2$ of n-type transparent conductive oxide (TCO) can be used as a material of the intermediate layer.

In the technique disclosed in Japanese Patent Application Laid-open No. 2006-120747, in the junction with n-type Si, n-types are joined together, and thus a low resistance can be easily achieved. However, in the junction with p-type Si, the junction becomes an n-p junction, and thus a low resistance can be hardly achieved. Therefore, even if a conductive film made of these materials is used, particularly when an electric current generated by the photoelectric conversion layer that concentrates light to generate power is large, the conductivity of the electric current is restricted by the resistance of the intermediate layer, thereby causing a problem such that the photoelectric conversion efficiency of the photoelectric converter is degraded.

SUMMARY OF THE INVENTION

It is an object of the present invention to at least partially solve the problems in the conventional technology.

According to an aspect of the present invention, there is provided a photoelectric converter, the photoelectric converter including a first photoelectric conversion layer including a first p-type semiconductor layer and a first n-type semiconductor layer; a second photoelectric conversion layer including a second p-type semiconductor layer and a second n-type semiconductor layer, and having light-absorbing wavelength characteristics different from characteristics of the first photoelectric conversion layer; an n-type transparent conductive oxide film that is arranged on a side in contact with the first n-type semiconductor layer between the first n-type semiconductor layer and the second p-type semiconductor layer, and has a band gap equal to or higher than 1.5 electron volts; and a p-type transparent conductive oxide film that is arranged on a side in contact with the second p-type semiconductor layer between the first n-type semiconductor layer and the second p-type semiconductor layer so as to form a p-n junction with the n-type transparent conductive oxide film, and has a band gap equal to or higher than 1.5 electron volts, wherein a width of a low carrier concentration region in a film thickness direction, in which a concentration of a free carrier formed near at least one of an interface on which the p-type transparent conductive oxide film comes into contact with the n-type transparent conductive oxide film and an interface on which the p-type transparent conductive oxide film comes into contact with the second p-type semiconductor layer is equal to or lower than $1\times10^{18}$ $cm^{-3}$, is equal to or less than 5 nanometers.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 2A and 2B are schematic diagrams for explaining layers near an intermediate layer shown in FIG. 1, where

DETAILED DESCRIPTION OF THE PREFERRED EMBODIMENTS

Exemplary embodiments of a photoelectric converter and a manufacturing method thereof, and a photoelectric conversion module according to the present invention will be explained below in detail with reference to the accompanying drawings. The present invention is not limited to the embodiments. In the drawings explained below, for easier understanding, scales of respective members may be shown differently from those of actual products.

Figure 1:
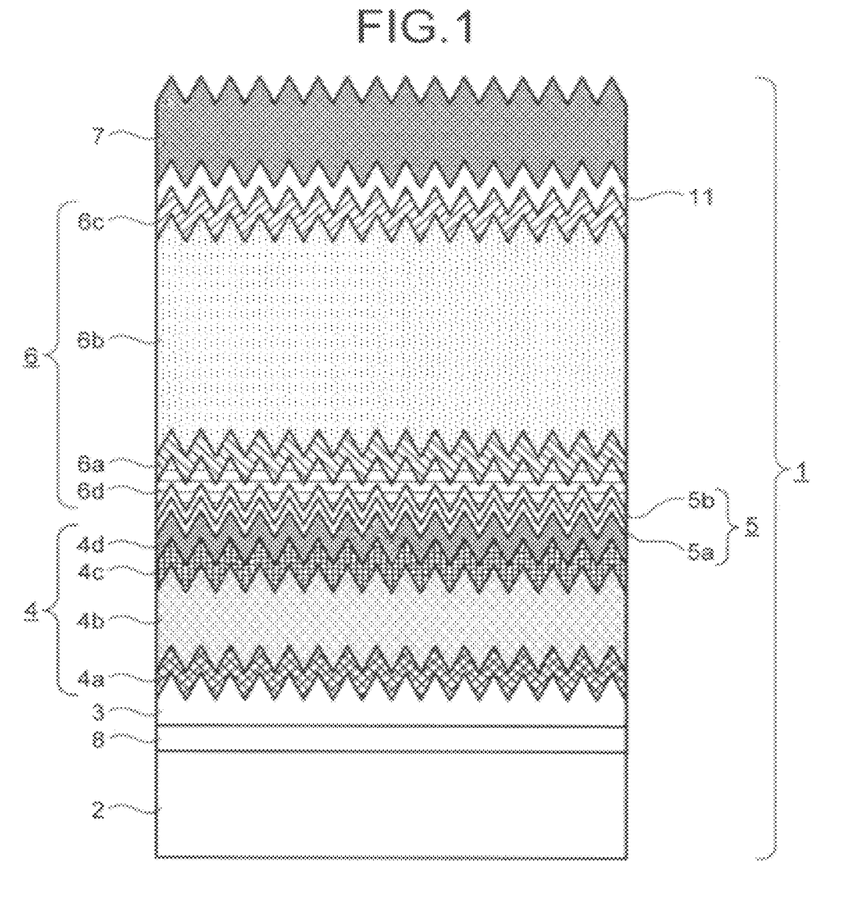
FIG. 1 is a sectional view of a schematic configuration of a photoelectric converter according to a first embodiment of the present invention.

FIG. 1 is a sectional view of a schematic configuration of a photoelectric converter according to a first embodiment of the present invention. In FIG. 1, in a photoelectric converter 1, a transparent electrode 3 having a surface texture structure with fine irregularities, an amorphous Si photoelectric conversion layer 4, an intermediate layer 5, a microcrystalline Si photoelectric conversion layer 6, and a backside electrode 7 are sequentially stacked on a substrate 2 having insulation properties and translucency. Further, as an impurity inhibition layer, an undercoat layer 8 can be formed on the substrate 2 as required. As a material of the undercoat layer 8, a silicon oxide film can be used.

The amorphous Si photoelectric conversion layer 4 and the microcrystalline Si photoelectric conversion layer 6 include Si as the main component thereof; however, have a different bandgap due to a difference in a crystalline structure, and therefore have different light-absorbing wavelength characteristics. In the photoelectric converter 1, a power generating element of the amorphous Si photoelectric conversion layer 4 and a power generating element of the microcrystalline Si photoelectric conversion layer 6 are serially connected in a stacking direction. When light enters from a side of the substrate 2, a voltage is generated in the amorphous Si photoelectric conversion layer 4 and the microcrystalline Si photoelectric conversion layer 6, and the power is taken out from the transparent electrode 3 and the backside electrode 7.

The photoelectric converter 1 constitutes a tandem solar battery. In the photoelectric converter 1, the amorphous Si photoelectric conversion layer 4 having a large bandgap that mainly absorbs short-wavelength light and converts the light to electric energy is arranged on a light incident side, and the microcrystalline Si photoelectric conversion layer 6 having a small bandgap that absorbs light having a wavelength longer than that of the amorphous Si photoelectric conversion layer 4 is arranged on a back side.

In the first embodiment, there has been explained a method that the amorphous Si photoelectric conversion layer 4 and the microcrystalline Si photoelectric conversion layer 6 having a different crystallization rate are used so that the light-absorbing wavelength characteristics of the stacked photoelectric conversion layers become different from each other. However, the element compositions of the photoelectric conversion layers can be different from each other. For example, the rate of Ge or C to be incorporated in the Si semiconductor layer is changed, and the bandgap can be adjusted so that light-absorbing wavelength characteristics become different in the stacked photoelectric conversion layers. In addition, the stacked photoelectric conversion layers can be three or more. In this case, the intermediate layer 5 can be provided two or more so that the intermediate layer 5 is put between the respective photoelectric conversion layers. Furthermore, a stacking sequence from the substrate 2 can be reversed so that light enters from a film surface opposite to the substrate 2. When light enters from the film surface side, the substrate 2 does not need to be transparent.

The amorphous Si photoelectric conversion layer 4 is formed of a p-type amorphous Si semiconductor layer 4a, an i-type amorphous Si semiconductor layer 4b, and an n-type amorphous Si semiconductor layer 4c stacked sequentially from the side of the substrate 2. Further, an i-type amorphous Si semiconductor layer can be inserted between the p-type amorphous Si semiconductor layer 4a and the i-type amorphous Si semiconductor layer 4b. The microcrystalline Si photoelectric conversion layer 6 is formed of a p-type microcrystalline Si semiconductor layer 6a, an i-type microcrystalline Si semiconductor layer 6b, and an n-type microcrystalline Si semiconductor layer 6c stacked sequentially from the side of the substrate 2.

An n-type amorphous Si semiconductor layer 4d having a carrier concentration higher than that of the n-type amorphous Si semiconductor layer 4c can be inserted between the intermediate layer 5 and the n-type amorphous Si semiconductor layer 4c. Further, a p-type microcrystalline Si semiconductor layer 6d having a carrier concentration higher than that of the p-type microcrystalline Si semiconductor layer 6a can be inserted between the intermediate layer 5 and the p-type microcrystalline Si semiconductor layer 6a.

For the backside electrode 7, a metal having a high reflectivity such as Al or Al alloy is used. Ag can be used instead of Al. When the backside electrode 7 with an excellent reflective performance is used, light having transmitted through the microcrystalline Si photoelectric conversion layer 6 is reflected by the backside electrode 7 toward the side of the microcrystalline Si photoelectric conversion layer 6 and photoelectrically converted, thereby improving the conversion efficiency. A transparent conductive layer 11 such as ZnO having appropriate optical characteristics can be inserted between the backside electrode 7 and the n-type microcrystalline Si semiconductor layer 6c, as shown in FIG. 1, in order to effectively reflect light in a wavelength region to be photoelectrically converted.

The intermediate layer 5 is put between the amorphous Si photoelectric conversion layer 4 and the microcrystalline Si photoelectric conversion layer 6. The intermediate layer 5 needs to transmit light that is not absorbed by the amorphous Si photoelectric conversion layer 4 toward the microcrystalline Si photoelectric conversion layer 6. Therefore, the bandgap of the intermediate layer 5 needs to be wider than at least that of the amorphous Si photoelectric conversion layer 4. Accordingly, the intermediate layer 5 requires a bandgap equal to or higher than 1.5 electron volts.

At the same time, the intermediate layer 5 needs to allow electrical conduction between the amorphous Si photoelectric conversion layer 4 and the microcrystalline Si photoelectric conversion layer 6. Further, when the intermediate layer 5 has an optical characteristic of reflecting light in a wavelength region absorbed by the amorphous Si photoelectric conversion layer 4 toward the amorphous Si photoelectric conversion layer 4, while transmitting light in a wavelength region absorbed by the microcrystalline Si photoelectric conversion layer 6, light having passed through the amorphous Si photoelectric conversion layer 4 passes again through the amorphous Si photoelectric conversion layer 4 and is photoelectrically converted, thereby improving the conversion efficiency.

The intermediate layer 5 needs to smoothly conduct carriers between the amorphous Si photoelectric conversion layer 4 and the microcrystalline Si photoelectric conversion layer 6 joined to the opposite sides thereof, and thus a carrier conductivity is essential. When carrier conduction is blocked between the amorphous Si photoelectric conversion layer 4 and the microcrystalline Si photoelectric conversion layer 6, an effective inter-element connection resistance increases, and a fill factor (FF) of the solar battery decreases, and as a result, the power generation efficiency decreases. Accordingly, the intermediate layer 5 needs to satisfy both the transmission factor and the carrier conductivity.

Figure 2A:
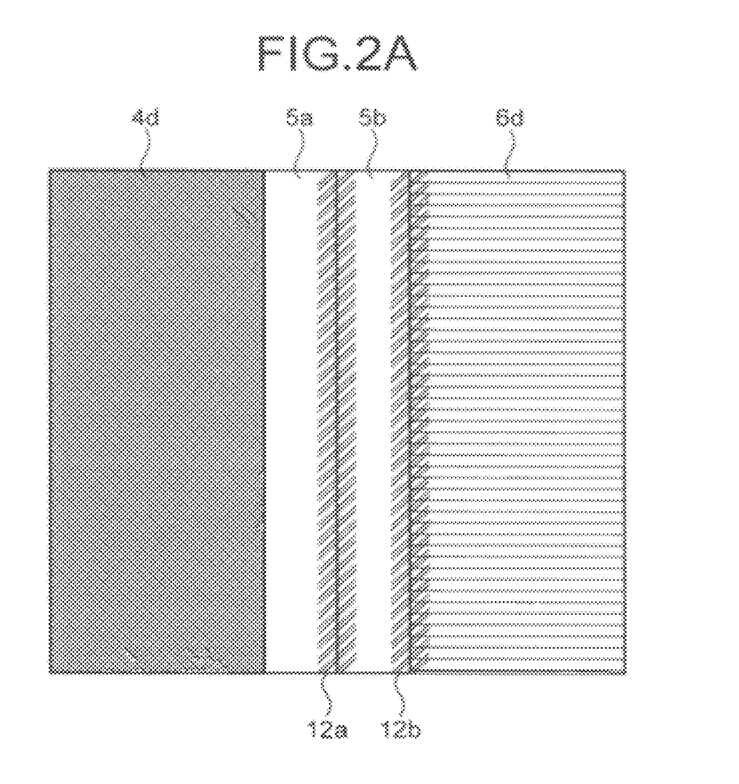
FIG. 2A is an enlarged diagram of the layers near the intermediate layer.
Figure 2B:
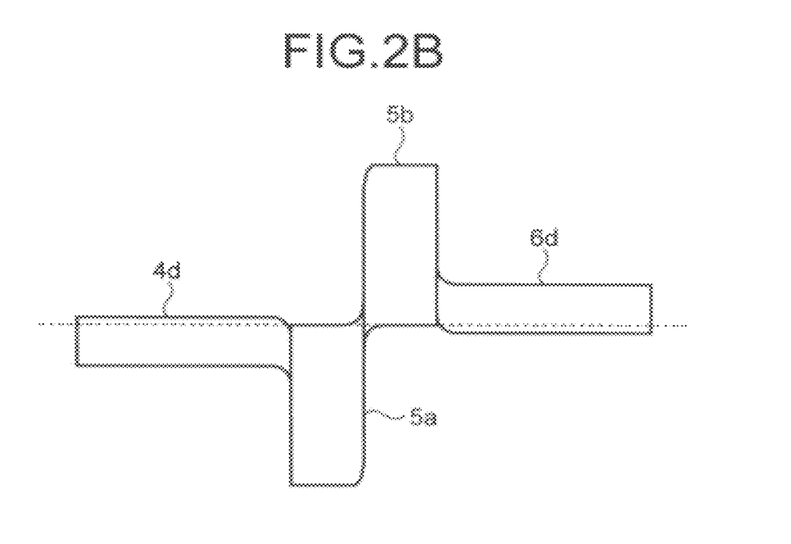
FIG. 2B depicts an energy band in each of the layers shown in FIG. 2A.

FIGS. 2A and 2B are schematic diagrams for explaining layers near the intermediate layer 5 shown in FIG. 1. FIG. 2A is an enlarged diagram of the layers near the intermediate layer 5. FIG. 2B depicts an energy band in each of the layers shown in FIG. 2A.

The intermediate layer 5 in which an n-type transparent conductive oxide film 5a and a p-type transparent conductive oxide film 5b are stacked sequentially from the side of the n-type amorphous Si semiconductor layer 4d is arranged between the n-type amorphous Si semiconductor layer 4d of the amorphous Si photoelectric conversion layer 4 and the p-type microcrystalline Si semiconductor layer 6d of the microcrystalline Si photoelectric conversion layer 6. That is, the n-type transparent conductive oxide film 5a is in contact with the n-type amorphous Si semiconductor layer 4d and the p-type transparent conductive oxide film 5b is in contact with the p-type microcrystalline Si semiconductor layer 6d.

A low carrier concentration region 12a is formed by a semiconductor junction near an interface between the n-type transparent conductive oxide film 5a and the p-type transparent conductive oxide film 5b. Similarly, a low carrier concentration region 12b is formed by a semiconductor junction near an interface between the p-type transparent conductive oxide film 5b and the p-type microcrystalline Si semiconductor layer 6d. The low carrier concentration region 12a and the low carrier concentration region 12b are defined as a region in which the concentration of a free carrier is equal to or lower than $1 \times 10^{18}$ cm$^{-3}$. For example, in a structure described below, it is defined that the width of the low carrier concentration regions 12a and 12b in a thickness direction is equal to or less than 5 nanometers.

FIGS. 2A and 2B depict an example in which an Al-doped ZnO layer is used as the n-type transparent conductive oxide film 5a and an Li-doped NiO layer is used as the p-type transparent conductive oxide film 5b.

The Al-doped ZnO layer as the n-type transparent conductive oxide film 5a was formed according to a radio frequency (RF) sputtering method by using two types of ZnO targets, that is, a ZnO target added with $Al_2O_3$ with a concentration of 2% by weight and a ZnO target added with $Al_2O_3$ with a concentration of 5% by weight. First, the Al-doped ZnO layer was formed by using the ZnO target added with $Al_2O_3$ with a concentration of 2% by weight. Thereafter, the last 2 nanometers in a film forming thickness of the Al-doped ZnO layer was formed by using the ZnO target added with $Al_2O_3$ with a concentration of 5% by weight. The substrate temperature at the time of film formation was set to 200° C.

The n-type transparent conductive oxide film 5a can be formed by a plasma CVD method or an evaporation method. Further, $InGaZnO_4$ can be used as the target and an $InGaZnO_4$ film having this composition can be used for the n-type transparent conductive oxide film 5a. While the $InGaZnO_4$ film can have a composition with an atomic ratio of In:Ga:Zn as approximately 1:1:1, the composition is not limited thereto. The material of the n-type transparent conductive oxide film 5a can be a compound having a composition ratio in a form of $In_xGa_yZn_zO_4$ (3x+3y+2z=8, where 0≤x≤1, 0≤y≤1, 0≤z≤1) and can be a material expressed as InGaZnO or IGZO.

The Li-doped NiO layer as the p-type transparent conductive oxide film 5b was formed according to the RF sputtering method by using two types of NiO targets, that is, an Li-doped NiO target with a concentration of 10% by atomic composition and an Li-doped NiO target with a concentration of 30% by atomic composition. In film formation of the Li-doped NiO layer, film formation for 2 nanometers of film thickness in the initial stage and the last stage was performed by using the NiO target with an Li concentration of 30% by atomic composition, and for the remaining film thickness, film formation was performed by using the NiO target with an Li concentration of 10% by atomic composition.

Film formation of the Li-doped NiO layer was performed by supplying only an Ar gas at a flow rate of 15 standard cubic centimeters per minutes (sccm) at the time of film formation using the NiO target with the Li concentration of 30% by atomic composition in the initial stage and the last stage. Film formation of other parts using the NiO target with the Li concentration of 10% by atomic composition was performed by supplying an oxygen gas at 5 sccm in addition to a nitrogen gas supplied at 10 sccm. In film formation in either case, a pressure in a film forming chamber was 0.5 pascal, and the substrate temperature at the time of film formation was 200° C. The substrate temperature at the time of film formation is determined according to the balance with a heat treatment temperature after film formation. The film formation can be performed at a room temperature. However, in this case, the heat treatment temperature after film formation needs to be high and heating is required for a long time.

By performing such film formation, the n-type dopant concentration of the n-type transparent conductive oxide film 5a can be increased toward the interface with the p-type transparent conductive oxide film 5b, near the interface between the n-type transparent conductive oxide film 5a and the p-type transparent conductive oxide film 5b. At the same time, the p-type dopant concentration of the p-type transparent conductive oxide film 5b can be increased toward the interface with the n-type transparent conductive oxide film 5a, near the interface between the n-type transparent conductive oxide film 5a and the p-type transparent conductive oxide film 5b. Accordingly, the width of the low carrier concentration region 12a in the thickness direction can be set equal to or less than 5 nanometers.

By performing such film formation, the p-type dopant concentration of the p-type transparent conductive oxide film 5b can be increased toward the interface with the p-type microcrystalline Si semiconductor layer 6d, near the interface between the p-type transparent conductive oxide film 5b and the p-type microcrystalline Si semiconductor layer 6d. Accordingly, the width of the low carrier concentration region 12b in the thickness direction can be set equal to or less than 5 nanometers.

After film formation of the p-type transparent conductive oxide film 5b, the p-type microcrystalline Si semiconductor layer 6d is formed by the plasma CVD method, for example. At this time, for example, the kind and the feeding amount of a reaction gas can be controlled such that the p-type dopant concentration in the film thickness of 2 nanometers in the initial film formation is increased to increase the p-type dopant concentration of the p-type microcrystalline Si semiconductor layer 6d toward the interface with the p-type transparent conductive oxide film 5b, near the interface between the p-type transparent conductive oxide film 5b and the p-type microcrystalline Si semiconductor layer 6d. Accordingly, the width of the low carrier concentration region 12b in the thickness direction can be set equal to or less than 5 nanometers.

Figure 3A:
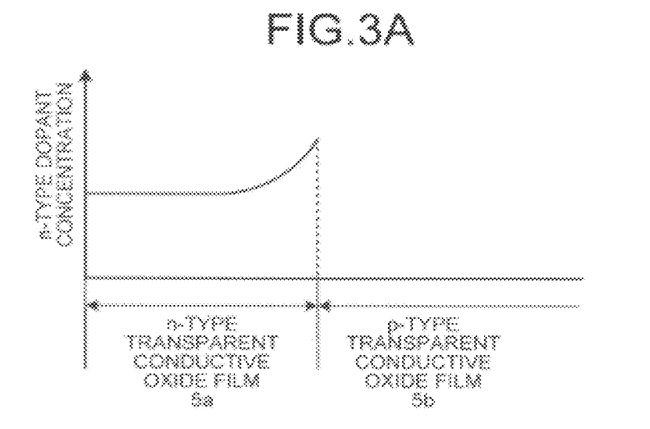
FIGS. 3A to 3C are schematic charts of an example of a dopant concentration in a film thickness direction of respective layers.
Figure 3B:
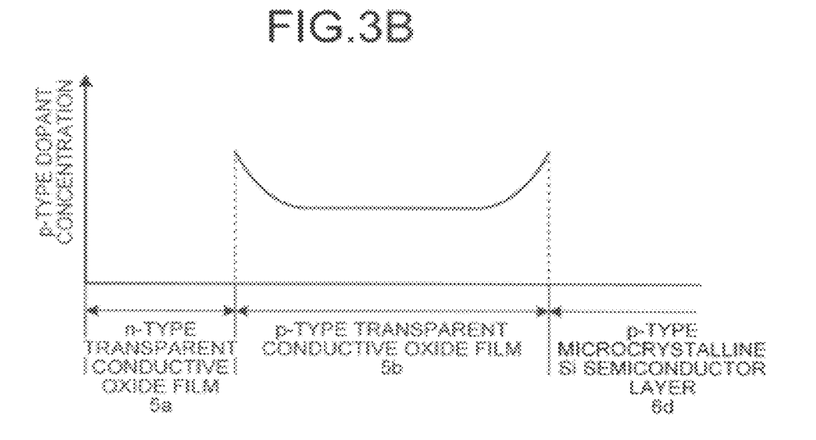
Figure 3C:
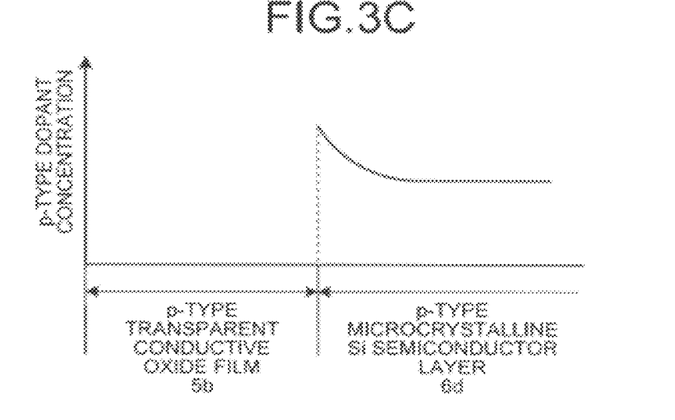

FIGS. 3A to 3C are schematic charts of an example of a dopant concentration in a film thickness direction of respective layers. FIG. 3A schematically depicts an example of an n-type dopant concentration in the film thickness direction of the n-type transparent conductive oxide film 5a. FIG. 3B schematically depicts an example of a p-type dopant concentration in the film thickness direction of the p-type transparent conductive oxide film 5b. FIG. 3C schematically depicts an example of a p-type dopant concentration in the film thickness direction of the p-type microcrystalline Si semiconductor layer 6d.

The p-type transparent conductive oxide film 5b can be formed by the CVD method or the evaporation method. Control of doping in this case can be performed by a method of changing the flow rate of the dopant or changing an evaporation source having a different dopant concentration.

As the p-type transparent conductive oxide film 5b, a $Cu_2O$ film can be used instead of the Li-doped NiO layer. In this case, because doping is not performed, adjustment of the doping amount is not performed.

In the intermediate layer 5 having such a configuration, an electric current flows between the amorphous Si photoelectric conversion layer 4 and the microcrystalline Si photoelectric conversion layer 6 mainly due to tunneling conduction and carrier recombination. Because the Al-doped ZnO and the Li-doped NiO used for the intermediate layer 5 according to the first embodiment are transparent conductive films, the original conduction characteristic is not affected much by the film thickness. However, when high-temperature heat treatment described here is not performed after film formation, the original carrier concentration and the mobility are not always realized sufficiently. Therefore, it is preferable to have a small film thickness.

An effect of the intermediate layer 5 is explained next. A Schottky junction between an n-type Si layer and an Al-doped n-type ZnO layer (n-type ZnO:Al) has a small Schottky barrier, because respective potential positions in a conduction band (an electron affinity) are close to each other. Therefore, control of doping is performed so that the carrier concentration in each layer becomes equal to or higher than $1\times10^{18}$ $cm^{-3}$, thereby exhibiting Ohmic characteristics.

Similarly, a Schottky junction between an Li-doped p-type NiO layer and a p-type Si layer has a small Schottky barrier, because respective potential positions in a valence band (an ionization potential) are close to each other. Therefore, control of doping is performed so that the carrier concentration in each layer becomes equal to or higher than $1\times10^{18}$ $cm^{-3}$, thereby exhibiting Ohmic characteristics.

On the other hand, the n-type transparent conductive oxide film 5a and the p-type transparent conductive oxide film 5b form a tunnel junction. If such a state that each layer is doped and degenerated so that the carrier concentration in each layer becomes a level of $1\times10^{19}$ $cm^{-3}$ (a state where the Fermi level is in the conduction band or valence band) is realized, a flow of an electric current due to n-p tunneling recombination between the n-type transparent conductive oxide film 5a and the p-type transparent conductive oxide film 5b can be easily realized without consuming much energy. Tunneling recombination means a series of operations of carriers from recombination of carriers conducted by tunneling until the carriers dissipate.

When the intermediate layer 5 having a p-n junction is formed by the transparent conductive oxide film, the junction resistance may not be reduced as expected due to film forming conditions and the stacked structure. To examine this cause, an I-V characteristic of the transparent conductive oxide film including the p-n junction was evaluated. As a result, it was found that a space-charge limited current was predominant when the junction resistance was high. The space-charge limited current means that the low carrier concentration region controls a resistance value.

Therefore, in the first embodiment, at the time of forming the intermediate layer 5 made of a transparent conductive oxide film and having a p-n junction, the expansion (width) of the low carrier concentration (equal to or lower than $1\times10^{18}$ $cm^{-3}$) layer formed near the interface between the p-type transparent conductive oxide film and upper and lower layers thereof in the film thickness direction is suppressed to equal to or less than 5 nanometers. That is, the expansion of the low carrier concentration region 12a and the low carrier concentration region 12b in the film thickness direction is suppressed to equal to or less than 5 nanometers. Accordingly, the junction resistance in the intermediate layer 5 can be suppressed to equal to or less than 300 $m\Omega cm^2$. By suppressing the junction resistance to equal to or less than 300 $m\Omega cm^2$, a decrease in the photoelectric conversion efficiency caused by the junction resistance can be suppressed even in a high electric current state at the time of highly concentrated power generation. As the width of the low carrier concentration region becomes narrower, a lower resistance can be realized. Consequently, it is desired that the width of the low carrier concentration region 12a and the low carrier concentration region 12b is equal to or less than 5 nanometers. By decreasing the width of the low carrier concentration region 12a and the low carrier concentration region 12b equal to or less than 2 nanometers, a lower junction resistance can be realized.

As described above, in the first embodiment, the intermediate layer 5 is formed by stacking the n-type transparent conductive oxide film 5a and the p-type transparent conductive oxide film 5b. The n-type dopant concentration of the n-type transparent conductive oxide film 5a is increased toward the interface with the p-type transparent conductive oxide film 5b, near the interface between the n-type transparent conductive oxide film 5a and the p-type transparent conductive oxide film 5b. Further, the p-type dopant concentration of the p-type transparent conductive oxide film 5b is increased toward the interface with the n-type transparent conductive oxide film 5a, near the interface between the n-type transparent conductive oxide film 5a and the p-type transparent conductive oxide film 5b. Accordingly, the width of the low carrier concentration region 12a can be reduced, thereby enabling to reduce the junction resistance. An increase in the dopant concentration is effective even in one of the n-type transparent conductive oxide film 5a and the p-type transparent conductive oxide film 5b.

The film forming method in which the dopant concentration is changed near the interface between the n-type transparent conductive oxide film 5a and the p-type transparent conductive oxide film 5b compensates a decrease in carriers by increasing the carriers only near the interface, thereby enabling to avoid a decrease in a light transmission rate when the entire carriers are increased. Therefore, according to the film forming method described above, the junction resistance between the n-type transparent conductive oxide film 5a and the p-type transparent conductive oxide film 5b is reduced, while minimizing absorption of light in the intermediate layer 5, thereby enabling to reduce the element resistance.

By suppressing the width of the low carrier concentration region 12a to equal to or less than 5 nanometers, a junction resistance equal to or less than 300 $m\Omega cm^2$ can be realized, thereby enabling to suppress a decrease in the photoelectric conversion efficiency even in a high electric current state at the time of highly concentrated power generation. As the width of the low carrier concentration region 12a becomes narrower, a lower resistance can be realized. Therefore, by setting the width thereof equal to or less than 2 nanometers, a lower junction resistance can be realized.

The low carrier concentration region tends to be developed near the interface between the p-type transparent conductive oxide film 5b and the p-type microcrystalline Si semiconductor layer 6d, other than near the p-n junction between the transparent conductive oxide films of the intermediate layer 5, and the low carrier concentration region 12b is formed near this interface. Therefore, the p-type dopant concentration of the p-type transparent conductive oxide film 5b is increased toward the interface with the p-type microcrystalline Si semiconductor layer 6d, near the interface between the p-type transparent conductive oxide film 5b and the p-type microcrystalline Si semiconductor layer 6d. Further, the p-type dopant concentration of the p-type microcrystalline Si semiconductor layer 6d is increased toward the interface with the p-type transparent conductive oxide film 5b. Accordingly, the width of the low carrier concentration region 12b can be reduced, thereby enabling to reduce the junction resistance. The increase in the dopant concentration is effective even in one of the p-type transparent conductive oxide film 5b and the p-type microcrystalline Si semiconductor layer 6d. Also in this case, by suppressing the width of the low carrier concentration region 12b to equal to or less than 5 nanometers, a junction resistance equal to or less than 300 mΩcm$^2$ can be realized. As the width of the low carrier concentration region 12b becomes narrower, a lower resistance can be realized. Therefore, by setting the width thereof equal to or less than 2 nanometers, a lower junction resistance can be realized.

Therefore, according to the first embodiment, by reducing the width of the low carrier concentration region formed near the interface between the p-type transparent conductive oxide film 5b of the intermediate layer 5 and another layer to reduce the junction resistance, the conductivity between a first photoelectric conversion layer (the amorphous Si photoelectric conversion layer 4) and a second photoelectric conversion layer (the microcrystalline Si photoelectric conversion layer 6) connected through the intermediate layer 5 can be improved and the photoelectric conversion efficiency thereof can be enhanced.

Reduction of the width of the low carrier concentration region 12b can be realized by another method other than the method of increasing the dopant concentration in the p-type transparent conductive oxide film 5b or the like. For example, if oxygen depletion or interstitial metal elements in the film is increased by controlling stoichiometry of the film, the n-type carrier concentration in the film can be increased. Further, if metal depletion or interstitial oxygen in the film is increased by controlling stoichiometry of the film, the p-type carrier concentration in the film can be increased. According to such a method, identical effects as those by increasing the n-type dopant concentration and by increasing the p-type dopant concentration can be acquired, thereby enabling to reduce the width of the low carrier concentration region.

Identical effects as in the case of increasing the p-type dopant concentration can be acquired by increasing the oxygen supply amount from the initial stage of film formation until film formation becomes steady to increase oxygen in the p-type transparent conductive oxide film 5b, and the width of the low carrier concentration region 12b decreases, thereby enabling to reduce the junction resistance.

An example in which the n-type amorphous Si semiconductor layer 4d is inserted between the intermediate layer 5 and the n-type amorphous Si semiconductor layer 4c has been explained above. However, even when the n-type amorphous Si semiconductor layer 4d is not inserted, identical effects can be acquired. Further, an example in which the p-type microcrystalline Si semiconductor layer 6d is inserted between the intermediate layer 5 and the p-type microcrystalline Si semiconductor layer 6a has been explained above. However, even when the p-type microcrystalline Si semiconductor layer 6d is not inserted, identical effects can be acquired.

In a second embodiment of the present invention, in the photoelectric converter having the configuration explained in the first embodiment, a $ZnIr_2O_4$ film of $ZnM_2O_4$ films (M is any one of Co, Rh, and Ir) is used as the p-type transparent conductive oxide film 5b. First, in the formation of the intermediate layer 5, an Al-doped ZnO layer is formed as the n-type transparent conductive oxide film 5a on the n-type amorphous Si semiconductor layer 4d in the same manner as in the first embodiment. That is, the n-type dopant concentration of the n-type transparent conductive oxide film 5a is increased first toward the surface on the interface side with the p-type transparent conductive oxide film 5b to be formed next, and the n-type transparent conductive oxide film 5a is formed.

The Al-doped ZnO layer as the n-type transparent conductive oxide film 5a was formed according to an RF (Radio Frequency) sputtering method by using a ZnO target added with $Al_2O_3$ with a concentration of 2% by weight. The substrate temperature at the time of film formation was set to 200° C.

The n-type transparent conductive oxide film 5a can be formed by the plasma CVD method or the evaporation method. Further, $InGaZnO_4$ can be used as the target and an $InGaZnO_4$ film having this composition can be used for the n-type transparent conductive oxide film 5a. Further, a compound having a composition ratio in a form of $In_xGa_yZn_zO_4$ ($3x+3y+2z=8$) can be used for the n-type transparent conductive oxide film 5a.

A $ZnIr_2O_4$ layer as the p-type transparent conductive oxide film 5b was formed according to the RF sputtering method on the n-type transparent conductive oxide film 5a by using a $ZnIr_2O_4$ target.

Film formation of the $ZnIr_2O_4$ layer was performed by supplying only an Ar gas at 15 sccm. A pressure in a film forming chamber was 0.5 pascal, and the substrate temperature at the time of film formation was 200° C. Accordingly, a $ZnIr_2O_4$ film in an amorphous state can be acquired as the p-type transparent conductive oxide film 5b. The substrate temperature at the time of film formation is determined according to the balance with a heat treatment temperature after film formation. Film formation can be performed at a room temperature. However, in this case, the heat treatment temperature after film formation needs to be high and heating is required for a long time.

$ZnIr_2O_4$ becomes a transparent conductive film that can acquire p-type conduction in the amorphous state. By performing annealing in an oxygen atmosphere at 200° C. for 2 hours after film formation, a high hole concentration can be acquired.

By performing film formation as described above, it is possible to prevent a state such that the surface of the n-type transparent conductive oxide film 5a is excessively oxidized at the time of forming the p-type transparent conductive oxide film 5b near the interface between the n-type transparent conductive oxide film 5a and the p-type transparent conductive oxide film 5b, to cause a decrease in the carrier concentration. Accordingly, the width of the low carrier concentration region 12a in the thickness direction can be set equal to or less than 5 nanometers.

In the intermediate layer 5 having such a configuration, an electric current flowing between the amorphous Si photoelectric conversion layer 4 and the microcrystalline Si photoelectric conversion layer 6 is determined mainly by tunneling conduction and carrier recombination. Because the Al-doped ZnO and $ZnIr_2O_4$ used for the intermediate layer 5 according to the second embodiment are transparent conductive films, the original conduction characteristic is not affected much by the film thickness. However, when high-temperature heat treatment described here is not performed after film formation, the original mobility is not always realized sufficiently. Therefore, it is preferable to have a small film thickness.

An effect of the intermediate layer 5 is explained next. A Schottky junction between an n-type Si layer and an Al-doped n-type ZnO layer (n-type ZnO:Al) has a small Schottky barrier, because respective potential positions in a conduction band (an electron affinity) are close to each other. Therefore, control of doping is performed so that the carrier concentration in each layer becomes equal to or higher than $1\times10^{18}$ cm$^{-3}$, thereby exhibiting Ohmic characteristics.

Similarly, a Schottky junction between the ZnIr$_2$O$_4$ layer and a p-type Si layer exhibits Ohmic characteristics, by controlling the carrier concentration so that the carrier concentration in each layer becomes equal to or higher than $1\times10^{18}$ cm$^{-3}$.

On the other hand, the n-type transparent conductive oxide film 5a and the p-type transparent conductive oxide film 5b form a tunnel junction. If such a state that each layer is doped and degenerated so that the carrier concentration in each layer becomes a level of $1\times10^{19}$ cm$^{-3}$ (a state where the Fermi level is in the conduction band or valence band) is realized, a flow of an electric current from the p-side to the n-side due to n-p tunneling recombination between the n-type transparent conductive oxide film 5a and the p-type transparent conductive oxide film 5b can be easily realized without consuming much energy. Tunneling recombination means a series of operations of carriers from recombination of carriers conducted by tunneling until the carriers dissipate.

When the intermediate layer 5 having a p-n junction was formed by the transparent conductive oxide film, it was not possible to reduce the junction resistance as expected due to film forming conditions and the stacked structure. To examine this cause, the I-V characteristic of the transparent conductive oxide film including the p-n junction was evaluated. As a result, it was found that a space-charge limited current was predominant when the junction resistance was high. The space-charge limited current means that the low carrier concentration region controls a resistance value.

A mechanism that develops such a low carrier concentration region was thoroughly examined, and as a result, it was ascertained that the cause was mutual interference in a film forming process based on a carrier generation mechanism. In the n-type transparent conductive oxide film such as ZnO, an origin of electrons serving as the n-type carriers is a dopant atom (for example, Al) and oxygen depletion in the film. Consequently, when film formation is performed in an atmosphere in which oxygen is present excessively, the n-type carriers decrease. This holds true even for the film surface after film formation. If the surface of the n-type transparent conductive oxide film after film formation comes into contact with active oxygen, excessive oxidation proceeds, and oxygen depletion caused at the time of film formation disappears, thereby decreasing carriers (mobile electrons).

On the other hand, in the p-type transparent conductive oxide film, an origin of holes serving as the p-type carriers is doped atoms and metal depletion in the film. Consequently, during film formation of the p-type transparent conductive oxide film, excessive oxygen is required. Therefore, normally, film formation of the p-type transparent conductive oxide film is performed in an oxygen atmosphere.

In film formation according to conventional techniques, the p-type transparent conductive oxide film has been formed in a film forming condition most suitable for the p-type film. Therefore, the n-type transparent conductive oxide film has been formed in a disadvantageous condition for the n-type transparent conductive oxide film such that a film surface of the n-type transparent conductive oxide film serving as a base is oxidized in the initial film forming stage of the p-type transparent conductive oxide film. Consequently, the n-type carriers near the surface decrease due to excessive oxidation of the n-type transparent conductive oxide film in the film forming process of the p-type transparent conductive oxide film.

Therefore, in the second embodiment, to suppress the expansion (width) of the low carrier concentration (equal to or lower than $1\times10^{18}$ cm$^{-3}$) layer generated near the interface between the p-type transparent conductive oxide film 5b and upper and lower layers thereof in the film thickness direction to equal to or less than 5 nanometers at the time of forming the intermediate layer 5 formed of the transparent conductive oxide film and having a p-n junction, the initial film forming condition of the p-type transparent conductive oxide film 5b is set to a condition of not degrading the n-type transparent conductive oxide film 5a, that is, to a condition of not supplying any oxygen gas.

To realize such a process, a material in which the hole concentration is less susceptible to an oxygen supply at the time of film formation is used to perform film formation in a condition of not supplying any oxygen at least in the initial stage of film formation. As a result, it is possible to prevent a state such that the oxygen depletion concentration of the n-type transparent conductive oxide film 5a near the junction interface (within 5 nanometers from the interface) between the n-type transparent conductive oxide film 5a and the p-type transparent conductive oxide film 5b becomes equal to or less than 10% as compared to the oxygen depletion concentration of the n-type transparent conductive oxide film 5a in a portion positioned on a side opposite to the junction interface. That is, the expansion (width) of the low carrier concentration (equal to or lower than $1\times10^{18}$ cm$^{-3}$) layer in the film thickness direction can be suppressed to equal to or less than 5 nanometers.

Figure 4:
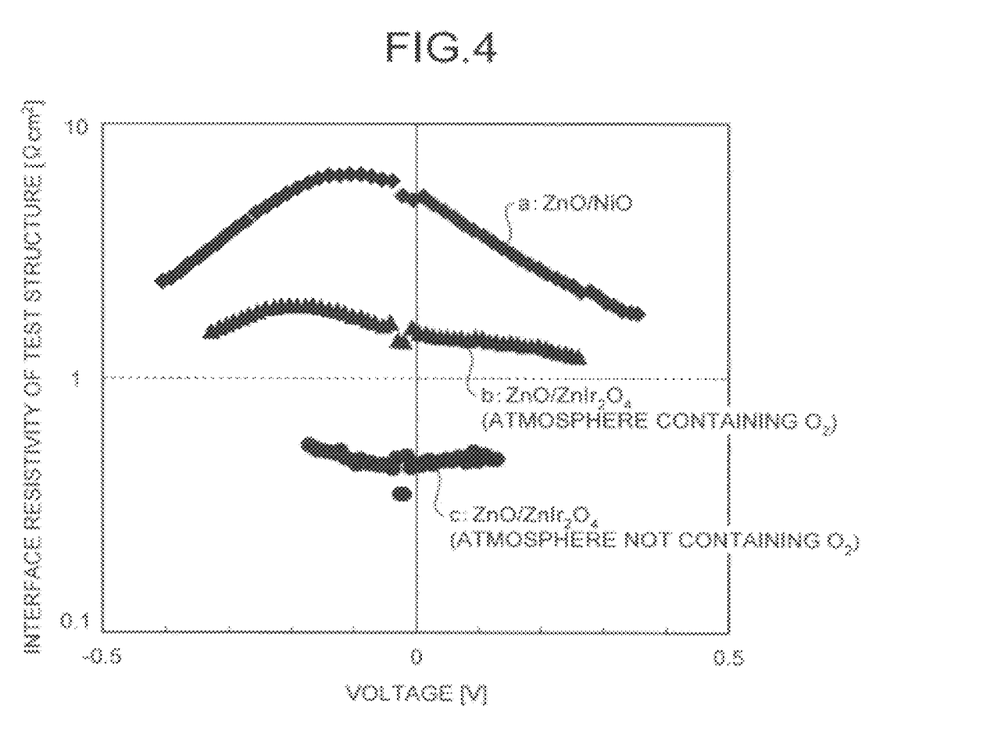
FIG. 4 depicts a relation between a forming process of an intermediate layer and a resistance thereof in a voltage-resistance curve.

FIG. 4 represents an experiment result of a relation between a forming process of the intermediate layer 5 and a resistance thereof. FIG. 4 depicts a relation between the forming process of the intermediate layer 5 and a resistance thereof in a voltage-resistance curve. In FIG. 4, a curve "a" corresponds to a case where an NiO film formed in an oxygen supply atmosphere is used as the p-type transparent conductive oxide film 5b in a test structure of the intermediate layer 5. A curve "b" corresponds to a case where a ZnIr$_2$O$_4$ film formed in the oxygen supply atmosphere is used as the p-type transparent conductive oxide film 5b in the test structure of the intermediate layer 5. A curve "c" corresponds to a case where a ZnIr$_2$O$_4$ film formed in an atmosphere without any oxygen was used as the p-type transparent conductive oxide film 5b in the test structure of the intermediate layer 5. As the n-type transparent conductive oxide film 5a in the test structure of the intermediate layer 5, a ZnO film was commonly used in these three types of test structures.

The vertical axis in FIG. 4 represents an interface resistivity ($\Omega$cm$^2$) in the test structure, which is obtained by obtaining an interface differential resistance of the test structure from a voltage when an electric current flows in the respective test structures in order to evaluate the resistance of the three types of test structures of the intermediate layer.

As can be understood from FIG. 4, a resistance value can be decreased to about one third by changing the NiO film to the ZnIr$_2$O$_4$ film as the p-type transparent conductive oxide film 5b. By forming the ZnIr$_2$O$_4$ film in a condition without any oxygen supply, the resistance value can be further decreased to one fifth.

A case where film formation of the ZnIr$_2$O$_4$ film is performed by supplying only an Ar gas has been explained above. However, the ZnIr$_2$O$_4$ film can be formed on the n-type transparent conductive oxide film 5a by using a ZnIr$_2$O$_4$ target at first in an Argon atmosphere, and subsequently, in an atmosphere of Ar+O$_2$ by the RF sputtering method. The substrate temperature at the time of film formation can be 200°

C., for example. Accordingly, an amorphous $ZnIr_2O_4$ film can be acquired as the p-type transparent conductive oxide film 5b.

The $ZnIr_2O_4$ becomes a transparent conductive film that can realize p-type conduction in an amorphous state. After film formation, by performing annealing in an oxygen atmosphere at 200° C. for 2 hours, a high hole concentration can be acquired.

As a result, n-p tunneling recombination between the n-type transparent conductive oxide film 5a and the p-type transparent conductive oxide film 5b can be easily realized without consuming much energy. Also in this case, the expansion of the low carrier concentration region 12a and the low carrier concentration region 12b in the film thickness direction can be suppressed to equal to or less than 5 nanometers, and the junction resistance of the intermediate layer 5 can be suppressed to equal to or less than 300 mΩcm². Accordingly, a decrease in the photoelectric conversion efficiency caused by the junction resistance can be suppressed even in a high electric current state at the time of highly concentrated power generation.

As described above, in the second embodiment, the intermediate layer 5 is formed by stacking the n-type transparent conductive oxide film 5a and the p-type transparent conductive oxide film 5b. The p-type transparent conductive oxide film 5b is formed of a material that is hardly influenced by the oxygen atmosphere at the time of film formation. Further, substantially any oxygen is not supplied at the time of forming the p-type transparent conductive oxide film 5b, near the interface between the n-type transparent conductive oxide film 5a and the p-type transparent conductive oxide film 5b. Accordingly, the width of the low carrier concentration region 12a developed due to excessive oxidation can be reduced, thereby enabling to reduce the junction resistance.

As a result, the n-p tunneling recombination between the n-type transparent conductive oxide film 5a and the p-type transparent conductive oxide film 5b can be easily realized without consuming much energy. By suppressing the expansion of the low carrier concentration region 12a in the film thickness direction to equal to or less than 5 nanometers, the junction resistance equal to or less than 300 mΩcm² can be realized, thereby enabling to suppress a decrease in the photoelectric conversion efficiency even in a high electric current state at the time of highly concentrated power generation. As the width of the low carrier concentration region 12a becomes narrower, a lower resistance can be realized. Therefore, by suppressing the width thereof to equal to or less than 2 nanometers, a lower junction resistance can be realized.

Therefore, according to the second embodiment, the width of the low carrier concentration region 12a near the surface developed by excessive oxidation on the surface of the n-type transparent conductive oxide film 5a at the time of forming the p-type transparent conductive oxide film 5b of the intermediate layer 5 is decreased to reduce the junction resistance, and thus the conductivity of the intermediate layer 5 can be improved and the photoelectric conversion efficiency thereof can be enhanced.

Further, a case where the n-type amorphous Si semiconductor layer 4d is inserted between the intermediate layer 5 and the n-type amorphous Si semiconductor layer 4c has been explained above. However, even when the n-type amorphous Si semiconductor layer 4d is not inserted, identical effects can be acquired. Furthermore, a case where the p-type microcrystalline Si semiconductor layer 6d is inserted between the intermediate layer 5 and the p-type microcrystalline Si semiconductor layer 6a has been explained above. However, even when the p-type microcrystalline Si semiconductor layer 6d is not inserted, identical effects can be acquired.

Among the $ZnM_2O_4$ (M is any one of Co, Rh, and Ir) films, even when Rh or Co is used as the metal element instead of Ir, identical effects can be acquired as in the case of using Ir.

In a third embodiment of the present invention, in formation of the intermediate layer 5 according to the second embodiment, a case where a target formed of $ZnM_2O_{(4+x)}$ (M is any one of Co, Ir, and Rh, and x≥1), which excessively contains oxygen, is used as the target at the time of film formation of the p-type transparent conductive oxide film 5b is explained. In the third embodiment, $ZnIr_2O_5$ is used as an example.

By using a target formed of $ZnIr_2O_5$ at the time of film formation of the p-type transparent conductive oxide film 5b according to the second embodiment, excessive oxygen required for film formation can be supplied from the target without supplying any oxygen gas at the time of film formation. Accordingly, excessive oxidation of the surface of the n-type transparent conductive oxide film 5a can be suppressed, and at the same time, a decrease in the p-type carrier concentration of the p-type transparent conductive oxide film 5b can be prevented.

As a result, the n-p tunneling recombination between the n-type transparent conductive oxide film 5a and the p-type transparent conductive oxide film 5b can be easily realized without consuming much energy. Accordingly, by suppressing the junction resistance to equal to or less than 300 mΩcm², a decrease in the photoelectric conversion efficiency caused by the junction resistance can be suppressed even in a high electric current state at the time of highly concentrated power generation. A case where a target formed of $ZnIr_2O_5$ is used at the time of film formation of the p-type transparent conductive oxide film 5b has been explained above. However, identical effects can be acquired when a target formed of $ZnM_2O_{(4+x)}$ (M is any one of Co, Ir, and Rh, and x≥1), which excessively includes oxygen, is used as the target.

In a fourth embodiment of the present invention, a case where pre-sputtering of a target for forming the p-type transparent conductive oxide film 5b is performed before film formation of the p-type transparent conductive oxide film 5b in a gas atmosphere, which does not contain substantially any oxygen gas, in formation of the intermediate layer 5 according to the first to third embodiments is explained.

By performing pre-sputtering of the target before film formation of the p-type transparent conductive oxide film 5b in the gas atmosphere, which does not contain substantially any oxygen gas, excessive oxidation of the surface of the n-type transparent conductive oxide film 5a is suppressed not only at the time of film formation but also in a process before film formation. As a result, the n-p tunneling recombination between the n-type transparent conductive oxide film 5a and the p-type transparent conductive oxide film 5b can be easily realized without consuming much energy. Accordingly, a decrease in the photoelectric conversion efficiency caused by the junction resistance can be suppressed even in a high electric current state at the time of highly concentrated power generation, by suppressing the junction resistance to equal to or less than 300 mΩcm².

In a fifth embodiment of the present invention, a case where film formation is performed in a gas atmosphere containing at least neon (Ne) by using the RF sputtering method at the time of film formation of the p-type transparent conductive oxide film 5b, in formation of the intermediate layer 5 according to the first to fourth embodiments is explained. At the time of film formation of the p-type transparent conductive oxide film 5b on the n-type transparent conductive oxide film 5a according to the RF sputtering method, an Ne gas is supplied at 15 sccm when film formation is performed for 2 nanometers of film thickness close to the interface with the n-type transparent conductive oxide film 5a (a first stage). Thereafter, the p-type transparent conductive oxide film 5b is formed for the remaining film thickness in a state where an Ne gas and oxygen are mixed and supplied, respectively, at 10 sccm and at 5 sccm (a second stage).

Because the mass of Ne is similar to that of an oxygen element, Ne effectively absorbs kinetic energy of oxygen in plasma, and can suppress sputtering damage (surface damage) due to oxygen ions near the interface between the n-type transparent conductive oxide film 5a and the p-type transparent conductive oxide film 5b. Accordingly, excessive oxidation of the surface of the n-type transparent conductive oxide film 5a is suppressed in the process at the time of film formation of the p-type transparent conductive oxide film 5b. As a result, the n-p tunneling recombination between the n-type transparent conductive oxide film 5a and the p-type transparent conductive oxide film 5b can be easily realized without consuming much energy. Accordingly, a decrease in the photoelectric conversion efficiency caused by the junction resistance can be suppressed even in a high electric current state at the time of highly concentrated power generation, by suppressing the junction resistance to equal to or less than 300 $m\Omega cm^2$.

In a sixth embodiment of the present invention, in the photoelectric converter having the configuration explained in the first embodiment, an Li-doped $Zn_xMg_{(1-x)}O$ film is used to generate p-type carriers as the p-type transparent conductive oxide film 5b. In formation of the intermediate layer 5, an Al-doped ZnO layer as the n-type transparent conductive oxide film 5a is formed on the n-type amorphous Si semiconductor layer 4d in the same manner as in the first embodiment. That is, the n-type dopant concentration of the n-type transparent conductive oxide film 5a is first increased toward the surface on an interface side with the p-type transparent conductive oxide film 5b to be formed next, thereby forming the n-type transparent conductive oxide film 5a.

Subsequently, a $Zn_{0.7}Mg_{0.3}O$ film is formed on the n-type transparent conductive oxide film 5a according to the RF sputtering method in an atmosphere of $Ar+O_2$ by using an Li-doped $Zn_{0.7}Mg_{0.3}O$ target with a concentration of 0.5% by atomic composition. The substrate temperature at the time of film formation can be set to 200° C., for example. Accordingly, an Li-doped amorphous $Zn_{0.7}Mg_{0.3}O$ film can be acquired as the p-type transparent conductive oxide film 5b. It suffices that this film is made of a material of ZnMgO, which is an oxide material with ZnO as the main component thereof and Mg is added thereto, and the atomic ratio of the Zn and Mg can be changed as appropriate.

The Li-doped $Zn_{0.7}Mg_{0.3}O$ becomes a transparent conductive film that can realize p-type conduction in an amorphous state. After film formation, by performing annealing in an oxygen atmosphere at 200° C. for 2 hours, a high hole concentration can be acquired.

As a result, n-p tunneling recombination between the n-type transparent conductive oxide film 5a and the p-type transparent conductive oxide film 5b can be easily realized without consuming much energy. Also in this case, the expansion of the low carrier concentration region 12a and the low carrier concentration region 12b in the film thickness direction can be suppressed to equal to or less than 5 nanometers, and the junction resistance of the intermediate layer 5 can be suppressed to equal to or less than 300 $m\Omega cm^2$. Accordingly, a decrease in the photoelectric conversion efficiency caused by the junction resistance can be suppressed even in a high electric current state at the time of highly concentrated power generation, by suppressing the junction resistance to equal to or less than 300 $m\Omega cm^2$.

In the formation of the intermediate layer 5 described above, in film formation of each layer near the interface between respective layers, the surface of a previous layer is exposed to film formation of the next layer in different film forming conditions. Therefore, the vicinity of the interface may be affected by film formation of the next layer to have a high resistance. Therefore, in a seventh embodiment of the present invention, in the forming method of the intermediate layer 5 described above, RF power to be applied at the time of film formation of the p-type transparent conductive oxide film 5b by the RF sputtering method is changed in two or more stages.

For example, when the p-type transparent conductive oxide film 5b is to be formed on the n-type transparent conductive oxide film 5a by the RF sputtering method, the RF power to be applied is set to 50 watts at the time of film formation for 2 nanometers of film thickness close to the interface with the n-type transparent conductive oxide film 5a (the first stage). Thereafter, in a steady state where the RF power to be applied is set to 100 watts, the p-type transparent conductive oxide film 5b is formed for the remaining film thickness (the second stage). By decreasing the RF power to be applied, a sputtering damage is reduced near the interface between the n-type transparent conductive oxide film 5a and the p-type transparent conductive oxide film 5b, thereby enabling to suppress a decrease of carriers near the interface.

However, a film forming speed is proportional to the RF power to be applied. That is, as the RF power to be applied decreases, the film forming speed becomes slow. Therefore, the RF power is maintained low only at the time of film formation for 2 nanometers of film thickness close to the interface with the n-type transparent conductive oxide film 5a, and in a steady state thereafter, the RF power is increased to increase the film forming speed. To reduce the sputtering damage, it is desired that the RF power in the first stage is half the RF power in the second stage in a steady state.

Accordingly, the sputtering damage is reduced near the interface between the n-type transparent conductive oxide film 5a and the p-type transparent conductive oxide film 5b, thereby enabling to suppress a decrease of carriers near the interface, while suppressing an increase of a film forming time resulting from a decrease in the RF power to be applied.

As a result, n-p tunneling recombination between the n-type transparent conductive oxide film 5a and the p-type transparent conductive oxide film 5b can be easily realized without consuming much energy. Also in this case, the expansion of the low carrier concentration region 12a and the low carrier concentration region 12b in the film thickness direction can be suppressed to equal to or less than 5 nanometers, and the junction resistance of the intermediate layer 5 can be suppressed to equal to or less than 300 $m\Omega cm^2$. Accordingly, a decrease in the photoelectric conversion efficiency caused by the junction resistance can be suppressed even in a high electric current state at the time of highly concentrated power generation, by suppressing the junction resistance to equal to or less than 300 $m\Omega cm^2$.

In the formation of the intermediate layer 5 described above, in film formation near the interface between respective layers, the surface of the previous layer is exposed to film formation of the next layer formed in different film forming conditions, and affected by film formation of the next layer, thereby causing a problem that the vicinity of the interface has a high resistance. Therefore, in an eighth embodiment of the present invention, in the forming method of the intermediate layer 5, a target-substrate distance is changed in two or more stages at the time of film formation of the p-type transparent conductive oxide film 5b by the RF sputtering method.

For example, when the p-type transparent conductive oxide film 5b is to be formed on the n-type transparent conductive oxide film 5a by the RF sputtering method, the target-substrate distance is set to 300 millimeters at the time of film formation for 2 nanometers of film thickness near the interface with the n-type transparent conductive oxide film 5a (the first stage). Thereafter, the p-type transparent conductive oxide film 5b is formed for the remaining film thickness in a steady state where the target-substrate distance is set to 100 millimeters (the second stage). By increasing the target-substrate distance, sputtering damage near the interface between the n-type transparent conductive oxide film 5a and the p-type transparent conductive oxide film 5b can be reduced, thereby enabling to suppress a decrease of carriers near the interface.

However, the film forming speed is inversely proportional to the target-substrate distance. That is, as the target-substrate distance becomes longer, the film forming speed becomes slower. Therefore, the target-substrate distance is maintained long only at the time of film formation for 2 nanometers of film thickness close to the interface with the n-type transparent conductive oxide film 5a, and in a steady state thereafter, the target-substrate distance is reduced to increase the film forming speed. To reduce the sputtering damage, it is desired that the target-substrate distance in the first stage is equal to or less than half the target-substrate distance in the second stage in a steady state.

Accordingly, the sputtering damage near the interface between the n-type transparent conductive oxide film 5a and the p-type transparent conductive oxide film 5b can be reduced to suppress a decrease of carriers near the interface, while suppressing an increase in a film forming time caused by an increase in the target-substrate distance.

As a result, n-p tunneling recombination between the n-type transparent conductive oxide film 5a and the p-type transparent conductive oxide film 5b can be easily realized without consuming much energy. Also in this case, the expansion of the low carrier concentration region 12a and the low carrier concentration region 12b in the film thickness direction can be suppressed to equal to or less than 5 nanometers, and the junction resistance of the intermediate layer 5 can be suppressed to equal to or less than 300 m$\Omega$cm$^2$. Accordingly, a decrease in the photoelectric conversion efficiency caused by the junction resistance can be suppressed even in a high electric current state at the time of highly concentrated power generation by suppressing the junction resistance to equal to or less than 300 m$\Omega$cm$^2$.

In a ninth embodiment of the present invention, in the formation of the intermediate layer 5 according to the first embodiment, a Zn-doped In$_2$O$_3$ layer (a material containing indium oxide as the main component thereof and zinc oxide in a small amount, hereinafter denoted as InZnO) is used as the n-type transparent conductive oxide film 5a, and an Li-doped NiO layer is used as the p-type transparent conductive oxide film 5b. As a film forming atmosphere, 5% of nitrogen (N) was added to Ar in a flow ratio. By adding nitrogen to the film forming atmosphere, the n-type transparent conductive oxide film 5a and the p-type transparent conductive oxide film 5b are doped with nitrogen. First, in the formation of the intermediate layer 5, an InZnO layer as the n-type transparent conductive oxide film 5a was formed first on the n-type amorphous Si semiconductor layer 4d.

The Zn-doped In$_2$O$_3$ layer (the InZnO layer) as the n-type transparent conductive oxide film 5a was formed in a film thickness of 10 nanometers by the RF sputtering method, by using an In$_2$O$_3$ target added with ZnO with a concentration of 10% by weight. The substrate temperature at the time of film formation was set to 200° C. The film forming atmosphere was such that 5% of nitrogen was added to Ar in a flow ratio, and pressure in a film forming chamber at the time of film formation was about 0.2 pascal.

After the n-type transparent conductive oxide film 5a was formed, the target was changed, while the substrate was maintained in vacuum, and the next p-type transparent conductive oxide film 5b was formed without exposing the substrate in an oxygen atmosphere.

The Li-doped NiO layer as the p-type transparent conductive oxide film 5b was formed in a film thickness of 10 nanometers by the RF sputtering method, by using an Li-doped NiO target with a concentration of 20% by atomic composition. Prior to film formation, pre-sputtering for cleaning the target was performed for 10 seconds, while a target shutter being closed.

The film forming atmosphere of the Li-doped NiO layer was such that 5% of nitrogen was added to Ar in a flow ratio. The pressure in the film forming chamber at the time of film formation was 0.2 pascal, and the substrate temperature at the time of film formation was 200° C. The substrate temperature at the time of film formation is determined according to the balance with a heat treatment temperature after the film formation. The film formation can be performed at a room temperature. However, in this case, the heat treatment temperature after the film formation needs to be high and heating is required for a long time.

By performing such film formation, it is possible to prevent a state such that carrier concentration decreases due to excessive oxidation of the surface of the n-type transparent conductive oxide film 5a at the time of film formation of the p-type transparent conductive oxide film 5b, near the interface between the n-type transparent conductive oxide film 5a and the p-type transparent conductive oxide film 5b. Accordingly, the width of the low carrier concentration region 12a in the thickness direction can be decreased to equal to or less than 5 nanometers.

In the intermediate layer 5 having such a configuration, an electric current flows between the amorphous Si photoelectric conversion layer 4 and the microcrystalline Si photoelectric conversion layer 6 mainly due to tunneling conduction and carrier recombination. Because InZnO and the Li-doped NiO used for the intermediate layer 5 according to the ninth embodiment are transparent conductive films, the original conduction characteristic is not affected much by the film thickness. However, when high-temperature heat treatment described here is not performed after film formation, the mobility is not always realized sufficiently. Therefore, it is preferable to have a small film thickness.

An effect of the intermediate layer 5 is explained next. An n-n junction between an n-type Si layer and the n-type InZnO layer (a material containing indium oxide as the main component thereof and zinc oxide in a small amount) has a small Schottky barrier, because respective potential positions in a conduction band (an electron affinity) are close to each other. Therefore, the n-n junction exhibits Ohmic characteristics by performing control of doping so that the carrier concentration in each layer becomes equal to or higher than $1 \times 10^{19}$ cm$^{-3}$.

Similarly, a p-p junction between the Li-doped NiO layer and a p-type Si layer exhibits Ohmic characteristics by controlling the carrier concentration so that the carrier concentration in each layer becomes equal to or higher than $1 \times 10^{19}$ cm$^{-3}$.

On the other hand, the n-type transparent conductive oxide film 5a and the p-type transparent conductive oxide film 5b form an n-p junction. If such a state that each layer is doped and degenerated so that the carrier concentration in each layer becomes a level of $1\times10^{19}$ cm$^{-3}$ (a state where the Fermi level is in the conduction band or valence band) is realized, a flow of electrons from the n-side to the p-side due to n-p tunneling recombination between the n-type transparent conductive oxide film 5a and the p-type transparent conductive oxide film 5b can be easily realized without consuming much energy. The tunneling recombination means a series of operations of carriers from recombination of carriers conducted by tunneling until the carriers dissipate.

When the intermediate layer 5 having a p-n junction is formed by using a transparent conductive oxide film, it has not been possible to reduce the junction resistance as expected due to film forming conditions and the stacked structure. To examine this cause, an I-V characteristic of the transparent conductive oxide film including a p-n junction was evaluated. As a result, it was found that a space-charge limited current was predominant when the junction resistance was high. The space-charge limited current means that the low carrier concentration region controls a resistance value.

A mechanism that develops such a low carrier concentration region was thoroughly examined, and as a result, it was ascertained that the cause was mutual interference in a film forming process based on a carrier generation mechanism of the transparent conductive oxide film. In the n-type transparent conductive oxide film such as ZnO, an origin of electrons serving as the n-type carriers is a dopant atom (for example, Al) and oxygen depletion in the film. Consequently, when film formation is performed in an atmosphere in which oxygen is present excessively, the n-type carriers decrease. This holds true even for the film surface after film formation. If the surface of the n-type transparent conductive oxide film after film formation comes into contact with active oxygen, excessive oxidation proceeds, and oxygen depletion caused at the time of film formation disappears, thereby decreasing carriers (mobile electrons).

On the other hand, an origin of holes serving as the p-type carriers is a doped atom and metal depletion in the film. Consequently, during film formation of the p-type transparent conductive oxide film, excessive oxygen is required. Therefore, normally, film formation of the p-type transparent conductive oxide film is performed in an oxygen supply atmosphere.

In film formation according to conventional techniques, the p-type transparent conductive oxide film has been formed in a film forming condition most suitable for decreasing the resistivity of the p-type film. Therefore, the n-type transparent conductive oxide film serving as a base has been formed in a disadvantageous condition for the n-type transparent conductive oxide film in the initial film forming stage of the p-type transparent conductive oxide film. Consequently, the concentration of the n-type carriers near the surface decreases due to excessive oxidation of the n-type transparent conductive oxide film in the film forming process of the p-type transparent conductive oxide film.

Therefore, in the ninth embodiment, to suppress the expansion (width) of the low carrier concentration (equal to or lower than $1\times10^{18}$ cm$^{-3}$) layer developed near the interface between the p-type transparent conductive oxide film 5b and upper and lower layers thereof in the film thickness direction to equal to or less than 5 nanometers at the time of film formation of the intermediate layer 5 formed of the transparent conductive oxide film and having a p-n junction, the film forming condition of the p-type transparent conductive oxide film 5b is set to a condition of not degrading the n-type transparent conductive oxide film 5a, that is, to a condition of not supplying any oxygen gas but supplying a nitrogen gas.

To realize such a process, instead of ZnO as an n-type transparent conductive oxide film, whose resistivity can be decreased by supplying nitrogen gas (being doped with nitrogen) at the time of film formation, $In_2O_3$, InZnO, and InSnO, which are oxide materials with indium oxide as the main component thereof (a material containing indium oxide as the main component thereof and tin oxide in a small amount, that is, Sn-doped $In_2O_3$, hereinafter denoted as InSnO), were selected. Thereafter, these materials were used to form the n-type transparent conductive oxide film 5a in an Ar gas atmosphere containing a nitrogen gas, and the p-type transparent conductive oxide film 5b was formed on the n-type transparent conductive oxide film 5a in a condition of supplying a nitrogen gas.

Figure 5:
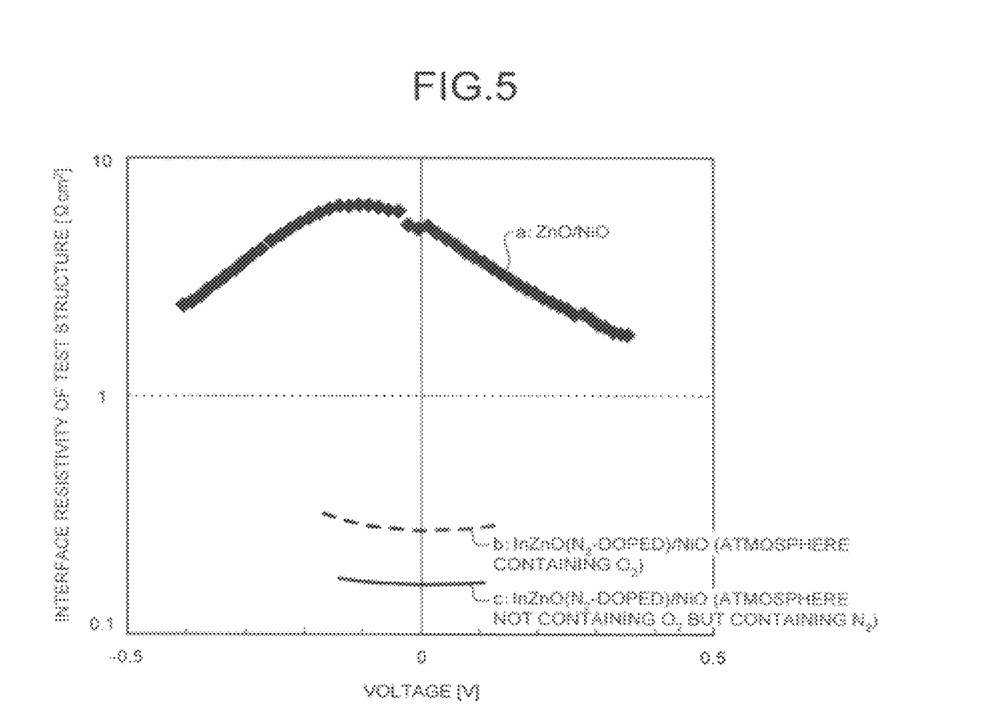
FIG. 5 depicts another relation between a forming process of an intermediate layer and a resistance thereof in a voltage-resistance curve.

FIG. 5 represents another experiment result of a relation between a forming process of the intermediate layer 5 and a resistance thereof. FIG. 5 depicts another relation between the forming process of the intermediate layer 5 and a resistance thereof in a voltage-resistance curve. In FIG. 5, a curve "a" corresponds to a test structure of the intermediate layer 5 having a junction structure between a ZnO film (the n-type transparent conductive oxide film 5a) formed in an atmosphere in which oxygen is not supplied and an NiO film (the p-type transparent conductive oxide film 5b) formed in an oxygen supply atmosphere. A curve "b" corresponds to a test structure of the intermediate layer 5 having a junction structure between a nitrogen-doped InZnO film (n-type transparent conductive oxide film 5a) formed in a nitrogen supply atmosphere and an NiO film (the p-type transparent conductive oxide film 5b) formed in an oxygen supply atmosphere. A curve "c" corresponds to a test structure of the intermediate layer 5 having a junction structure between a nitrogen-doped InZnO film (the n-type transparent conductive oxide film 5a) formed in a nitrogen supply atmosphere and an NiO film (the p-type transparent conductive oxide film 5b) formed in an atmosphere in which oxygen is not supplied but nitrogen is supplied.

The vertical axis in FIG. 5 represents an interface resistivity ($\Omega cm^2$) in the test structure, which is obtained by obtaining a differential resistance of the test structure from a voltage when an electric current flows in the respective test structures in order to evaluate the resistance of the three types of test structures of the intermediate layer.

As can be understood from FIG. 5, a resistance value can be decreased to about one third by changing the ZnO film as the n-type transparent conductive oxide film 5a to the nitrogen-doped InZnO film. By forming the NiO film as the p-type transparent conductive oxide film Sb in a condition of supplying nitrogen instead of oxygen, the resistance value can be further decreased to one fifth.

On the other hand, it was experimentally confirmed that when a nitrogen-doped ZnO or SnO film was used instead of a material mainly containing In as the n-type transparent conductive oxide film 5a, the junction resistance of the intermediate layer 5 was increased. Accordingly, satisfactory results cannot always be obtained by using a material doped with nitrogen as the n-type transparent conductive oxide film 5a.

A film using $Cu_2O$ or $ZnM_2O_4$ (M is any one of Co, Rh, and Ir) as a base material can be used instead of the NiO layer as the p-type transparent conductive oxide film 5b, whose resistivity can be decreased by supplying a nitrogen gas (being doped with nitrogen) at the time of film formation.

As a result, the n-p tunneling recombination between the n-type transparent conductive oxide film 5a and the p-type transparent conductive oxide film 5b can be easily realized without consuming much energy. Also in this case, the expansion of the low carrier concentration region 12a can be suppressed to equal to or less than 5 nanometers, and the junction resistance of the intermediate layer 5 can be suppressed to equal to or less than 300 mΩcm². Accordingly, a decrease in the photoelectric conversion efficiency caused by the junction resistance can be suppressed even in a high electric current state at the time of highly concentrated power generation. As the width of the low carrier concentration region 12a becomes narrower, a lower junction resistance of the intermediate layer 5 can be realized. Therefore, by suppressing the width thereof to equal to or less than 2 nanometers, a lower junction resistance can be realized.

Therefore, according to the ninth embodiment, the conductivity of the intermediate layer 5 can be improved and the photoelectric conversion efficiency thereof can be enhanced, by decreasing the width of the low carrier concentration region 12a near the surface caused by excessive oxidation of the surface of the n-type transparent conductive oxide film 5a at the time of film formation of the p-type transparent conductive oxide film 5b of the intermediate layer 5.

Further, a case where the n-type amorphous Si semiconductor layer 4d is inserted between the intermediate layer 5 and the n-type amorphous Si semiconductor layer 4c has been explained above. However, even when the n-type amorphous Si semiconductor layer 4d is not inserted, identical effects can be acquired. Furthermore, a case where the p-type microcrystalline Si semiconductor layer 6d is inserted between the intermediate layer 5 and the p-type microcrystalline Si semiconductor layer 6a has been explained above. However, even when the p-type microcrystalline Si semiconductor layer 6d is not inserted, identical effects can be acquired.

In the above explanations, a case where Ar and a nitrogen gas are mixed and used as an atmosphere gas at the time of film formation has been described. However, instead of a nitrogen gas, $NH_3$ or the like that is decomposed to generate nitrogen can be also mixed in the atmosphere gas.

In the above explanations, an example in which the n-type transparent conductive oxide film 5a and the p-type transparent conductive oxide film 5b are doped with nitrogen due to the atmosphere gas has been described. However, nitrogen doping to the n-type transparent conductive oxide film 5a and the p-type transparent conductive oxide film 5b can be also performed by mixing nitrogen in a sputtering target in a form of AlN, TiN, or GaN in advance. In this case, nitrogen doping by using the atmosphere gas can be used together.

In the above explanations, an example in which the n-type transparent conductive oxide film 5a and the p-type transparent conductive oxide film 5b are doped with nitrogen has been described. However, identical effects can be acquired by using any element of P, As, and Sb, which are V-group elements, other than nitrogen. Further, a plurality of kinds of these elements can be doped.

It is preferable to set the concentration of these doped elements (doping elements) such that a ratio of containing these doping elements is from 0.1% by atom to 5% by atom (atomic ratio), when these doping elements and oxygen are mixed to 100%. If the concentration of the doping element is lower than 0.1% by atom, there is no reduction effect of the junction resistance of the intermediate layer 5. Further, if the concentration of the doping element is higher than 5% by atom, the reduction effect of the junction resistance of the intermediate layer 5 is saturated, whereas a tendency of decreasing transmittance appears noticeably in a region of wavelength equal to or less than 500 nanometers in transmittance spectrum of light. Such a composition rate of doping elements can be analyzed by a secondary ion mass spectrometer (SIMS).

Further, in the curve c in FIG. 5, because the doping element such as nitrogen are doped to both the n-type transparent conductive oxide film 5a and the p-type transparent conductive oxide film 5b, the reduction effect of the junction resistance of the intermediate layer 5 is most excellent. However, the doping element can be doped only to the n-type transparent conductive oxide film 5a or the p-type transparent conductive oxide film 5b. Furthermore, in at least one of the n-type transparent conductive oxide film 5a and the p-type transparent conductive oxide film 5b, the doping element can be doped thereto only near the interface between the n-type transparent conductive oxide film 5a and the p-type transparent conductive oxide film 5b.

By doping the doping element such as nitrogen to the n-type transparent conductive oxide film 5a, a free electron concentration in the n-type transparent conductive oxide film 5a increases. Thereafter, the influence of excessive oxidation of the n-type transparent conductive oxide film 5a caused by oxygen applied in the process of forming the p-type transparent conductive oxide film 5b can be reduced. On the other hand, by doping the doping element such as nitrogen to the p-type transparent conductive oxide film 5b, it is possible to prevent a state such that a defect occurs in the p-type transparent conductive oxide film 5b without supplying any oxygen.

The conductivity tends to decrease when the p-type transparent conductive oxide film 5b is doped with the doping element such as nitrogen. However, as can be understood from the comparison between the curve b and the curve c in FIG. 5, in the case of a junction between the n-type transparent conductive oxide film 5a and the p-type transparent conductive oxide film 5b, the junction resistance considerably decreases by doping the doping element such as nitrogen.

Furthermore, by not using an oxygen containing atmosphere but using a nitrogen containing atmosphere at the time of film formation of the n-type transparent conductive oxide film 5a, an effect of preventing and suppressing oxidation of the surface of Si serving as the base can be acquired. When the oxygen containing atmosphere is used at the time of film formation of the n-type transparent conductive oxide film 5a, the surface of Si serving as the base is oxidized, and the junction resistance on the interface between Si and the n-type transparent conductive oxide film 5a may increase. However, by using the nitrogen containing atmosphere as the film forming atmosphere of the n-type transparent conductive oxide film 5a, oxidation of the surface of Si serving as the base can be reduced.

As explained above, in the above embodiments of the present invention, the first photoelectric conversion layer including the n-type semiconductor layer and the second photoelectric conversion layer including the p-type semiconductor layer, which respectively have light-absorbing wavelength characteristics different from each other, are stacked, and the translucent intermediate layer is included between the n-type semiconductor layer of the first photoelectric conversion layer and the p-type semiconductor layer of the second photoelectric conversion layer.

Because the n-type semiconductor layer of the first photoelectric conversion layer in the interface with the intermediate layer comes into contact with the n-type transparent conductive oxide film, transfer of electrons from the n-type semiconductor layer to the n-type transparent conductive oxide film can be performed easily. Furthermore, because the p-type semiconductor layer of the second photoelectric conversion layer comes into contact with the p-type transparent conductive oxide film, transfer of holes from the p-type semiconductor layer to the p-type transparent conductive oxide film can be performed easily.

Furthermore, in the interface on which the n-type transparent conductive oxide film comes into contact with the p-type transparent conductive oxide film, tunneling recombination of electrons and holes can be caused to occur by increasing the carrier concentration in the both films sufficiently high. Thus, the tunneling recombination is improved, and as a result, the conductivity between the first photoelectric conversion layer and the second photoelectric conversion layer can be improved, thereby enabling to realize a highly efficient photoelectric converter.

By selecting a material having crystal with a relatively small basic structure such as a simple cubic structure or a spinel structure in the crystal growth in an equilibrium system as a material of the p-type transparent conductive oxide film constituting the intermediate layer, the original conduction characteristics of the crystal can be easily acquired in an amorphous or microcrystalline state. Therefore, heat treatment after film formation is not required or heat treatment at a temperature equal to or lower than 300° C. is sufficient to improve the conduction characteristics of the intermediate layer. Consequently, high-temperature heat treatment exceeding 300° C. is not required, thereby enabling to prevent degradation of characteristics of the film used for the stacked thin-film solar battery.

As described above, according to the above embodiments, a stacked photoelectric converter having a low junction resistance can be realized by a relatively low-temperature process, and a photoelectric converter that can maintain highly efficient characteristics even in a concentrated operating condition in which a high electric current flows can be realized. Further, because light distribution to the first photoelectric conversion layer and the second photoelectric conversion layer can be adjusted by the intermediate layer, a degree of freedom in a highly efficient design can be improved, and a highly efficient photoelectric converter can be realized.

The above embodiments are particularly suitable for improving the conversion efficiency of the photoelectric conversion layer including a semiconductor layer having Si as the main component thereof; however, these embodiments are also applicable to a material such as a compound semiconductor system or organic system other than the Si system. Further, in the above embodiments, an application example to the intermediate layer has been described. However, the effect of achieving a low resistance can be also acquired by applying the p-n junction structure of the transparent conductive oxide film described above to between the transparent electrode 3 and the amorphous Si photoelectric conversion layer 4 or to the transparent conductive layer 11 at the back side.

Further, the conductivity of the intermediate layer 5 can be improved and a stacked photoelectric conversion module having an excellent photoelectric conversion efficiency can be realized, by forming a plurality of photoelectric converters having the configuration explained in the above embodiments on a transparent insulating substrate and electrically connecting at least two photoelectric converters. For example, it suffices that the transparent electrode 3 of one of the adjacent photoelectric converters and the backside electrode 7 of the other photoelectric converter are electrically connected in series. Furthermore, a plurality of photoelectric converters can be electrically connected in parallel. For example, it suffices that the transparent electrodes 3 and the backside electrodes 7 of adjacent photoelectric conversion cells are electrically connected.

According to the present invention, the conductivity of an intermediate layer in a stacked photoelectric converter can be improved, and the photoelectric conversion efficiency thereof can be enhanced.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A photoelectric converter comprising:
a first silicon-based photoelectric conversion layer including a first p-type semiconductor layer and a first n-type semiconductor layer;
a second silicon-based photoelectric conversion layer formed on the first silicon-based photoelectric conversion layer, the second silicon-based photoelectric conversion layer including a second p-type semiconductor layer and a second n-type semiconductor layer, and having light-absorbing wavelength characteristics different from characteristics of the first photoelectric conversion layer;
an n-type transparent conductive oxide film that is arranged on a side in direct contact with the first n-type semiconductor layer between the first n-type semiconductor layer and the second p-type semiconductor layer, and has a bandgap equal to or higher than 1.5 electron volts; and
a p-type transparent conductive oxide film that is arranged on a side in direct contact with the second p-type semiconductor layer between the first n-type semiconductor layer and the second p-type semiconductor layer so as to form a p-n junction with the n-type transparent conductive oxide film, and having a bandgap equal to or higher than 1.5 electron volts, wherein the n-type transparent conductive oxide film is in direct contact with the p-type transparent conductive oxide film, and wherein
a width of a low carrier concentration region in a film thickness direction, in which a concentration of a free carrier formed near at least one of an interface on which the p-type transparent conductive oxide film comes into contact with the n-type transparent conductive oxide film and an interface on which the p-type transparent conductive oxide film comes into contact with the second p-type semiconductor layer is equal to or lower than $1 \times 10^{18}$ cm$^{-3}$, and is equal to or less than 5 nanometers.

2. The photoelectric converter according to claim 1, wherein a concentration of an n-type dopant of the n-type transparent conductive oxide film increases toward an interface with the p-type transparent conductive oxide film in a film thickness direction.

3. The photoelectric converter according to claim 1, wherein a concentration of a p-type dopant of the p-type transparent conductive oxide film increases toward an interface with the n-type transparent conductive oxide film in a film thickness direction.

4. The photoelectric converter according to claim 1, wherein a base material of the n-type transparent conductive oxide film is ZnO, Zn-doped $In_2O_3$, Sn-doped $In_2O_3$, or InGaZnO.

5. The photoelectric converter according to claim 1, wherein a base material of the p-type transparent conductive oxide film is NiO, $Cu_2O$, $ZnM_2O_4$ (wherein M is any one of Co, Rh and Ir), or ZnMgO.

6. The photoelectric converter according to claim 1, wherein at least one kind of element of N, P, As, and Sb is doped to at least one of the p-type transparent conductive oxide film and the n-type transparent conductive oxide film.

7. A photoelectric conversion module in which two or more of the photoelectric converters according to claim 1 are electrically connected in series or in parallel.

8. A photoelectric converter comprising:
a first silicon-based photoelectric conversion layer including a first p-type semiconductor layer and a first n-type semiconductor layer;
a second silicon-based photoelectric conversion layer formed on the first silicon-based photoelectric conversion layer, the second silicon-based photoelectric conversion layer including a second p-type semiconductor layer and a second n-type semiconductor layer, and having light-absorbing wavelength characteristics different from characteristics of the first photoelectric conversion layer;
an n-type transparent conductive oxide film that is arranged on a side in direct contact with the first n-type semiconductor layer between the first n-type semiconductor layer and the second p-type semiconductor layer, and has a bandgap equal to or higher than 1.5 electron volts; and
a p-type transparent conductive oxide film that is arranged on a side in direct contact with the second p-type semiconductor layer between the first n-type semiconductor layer and the second p-type semiconductor layer so as to form a p-n junction with the n-type transparent conductive oxide film, and having a bandgap equal to or higher than 1.5 electron volts, wherein the n-type transparent conductive oxide film is in direct contact with the p-type transparent conductive oxide film, and wherein
at least one kind of element of N, P, As, and Sb is doped to at least one of the p-type transparent conductive oxide film and at n-type transparent conductive oxide film; and
wherein a concentration of the doped element is from 0.1% by atom to 5% by atom based on a sum of oxygen in the p-type transparent conductive oxide film or in the n-type transparent conductive oxide film and the doped element.

9. The photoelectric converter according to claim 8, wherein carrier concentrations of the n-type transparent conductive oxide film and the p-type transparent conductive oxide film are equal to or higher than $1 \times 10^{19}$ $cm^{-3}$.

10. The photoelectric converter according to claim 8, wherein a base material of the n-type transparent conductive oxide film is a material containing indium oxide as a main component.

11. The photoelectric converter according to claim 8, wherein a base material of the p-type transparent conductive oxide film is NiO, $ZnM_2O_4$ (wherein M is any one of Co, Rh and Ir), or $Cu_2O$.

12. A photoelectric conversion module in which two or more of the photoelectric converters according to claim 8 are electrically connected in series or in parallel.

13. A manufacturing method of a photoelectric converter, the method comprising:
a first step of forming a first silicon-based photoelectric conversion layer including a first p-type semiconductor layer and a first n-type semiconductor layer on a substrate in this order;
a second step of forming an n-type transparent conductive oxide film having a bandgap equal to or higher than 1.5 electron volts directly on the first n-type semiconductor layer;
a third step of forming a p-type transparent conductive oxide film having a bandgap equal to or higher than 1.5 electron volts directly on the n-type transparent conductive oxide film; and
a fourth step of forming a second silicon-based photoelectric conversion layer including a second p-type semiconductor layer and a second n-type semiconductor layer so that the second p-type semiconductor layer comes into direct contact with the p-type transparent conductive oxide film, wherein
a width of a low carrier concentration region in a film thickness direction, in which a concentration of a free carrier formed near at least one of an interface on which the p-type transparent conductive oxide film comes into contact with the n-type transparent conductive oxide film and an interface on which the p-type transparent conductive oxide film comes into contact with the second p-type semiconductor layer is equal to or lower than $1 \times 10^{18}$ $cm^{-3}$, and is equal to or less than 5 nanometers.

14. The manufacturing method of a photoelectric converter according to claim 13, wherein at the third step, a sputtering method is used to form the p-type transparent conductive oxide film, and an oxygen supply amount at a time of film formation is increased from an initial stage of film formation to a steady state.

15. The manufacturing method of a photoelectric converter according to claim 13, wherein at the third step, the p-type transparent conductive oxide film is formed by a sputtering method, and the third step includes a process of forming the p-type transparent conductive oxide film in a gas atmosphere not containing any oxygen gas.

16. The manufacturing method of a photoelectric converter according to claim 13, wherein at the third step, the p-type transparent conductive oxide film is formed by a sputtering method, and pre-sputtering of a target of forming the p-type transparent conductive oxide film is performed in a gas atmosphere not containing any oxygen gas.

17. The manufacturing method of a photoelectric converter according to claim 13, wherein at the third step, when an n-p junction between the n-type transparent conductive oxide film and the p-type transparent conductive oxide film is formed by forming the p-type transparent conductive oxide film by a sputtering method, a gas in which nitrogen or $NH_3$ is added to Ar is used as an atmosphere gas.

18. The manufacturing method of a photoelectric converter according to claim 13, wherein at the third step, the p-type transparent conductive oxide film is formed by a sputtering method, and any one of AlN, TiN, and GaN is mixed in advance in a sputtering target for forming the p-type transparent conductive oxide film.

* * * * *